(12) United States Patent
Yang

(10) Patent No.: US 8,030,642 B2
(45) Date of Patent: Oct. 4, 2011

(54) ORGANIC THIN FILM TRANSISTOR, METHOD OF MANUFACTURING THE SAME, AND FLAT PANEL DISPLAY HAVING THE SAME

(75) Inventor: Nam-Choul Yang, Suwon-si (KR)

(73) Assignee: Samsung Mobile Display Co., Ltd. (KR)

( * ) Notice: Subject to any disclaimer, the term of this patent is extended or adjusted under 35 U.S.C. 154(b) by 217 days.

(21) Appl. No.: 11/267,425

(22) Filed: Nov. 4, 2005

(65) Prior Publication Data

US 2006/0099526 A1 May 11, 2006

(30) Foreign Application Priority Data

Nov. 10, 2004 (KR) .................. 10-2004-0091489

(51) Int. Cl.
*H01L 51/00* (2006.01)
(52) U.S. Cl. .................. 257/40; 257/57; 257/E51.007
(58) Field of Classification Search ........... 257/E51.006, 257/E27.117, 40, 57, E51.005–E51.007; 438/161
See application file for complete search history.

(56) References Cited

U.S. PATENT DOCUMENTS

| | | | |
|---|---|---|---|
| 4,613,398 A * | 9/1986 | Chiong et al. ............... 430/323 |
| 4,732,659 A * | 3/1988 | Schachter et al. ........ 204/192.25 |
| 5,994,157 A | 11/1999 | Aggas et al. |
| 6,080,606 A * | 6/2000 | Gleskova et al. ............ 438/151 |
| 6,383,926 B2 * | 5/2002 | Powell ......................... 438/678 |
| 6,429,916 B1 * | 8/2002 | Nakata et al. ................ 349/106 |
| 6,903,377 B2 * | 6/2005 | Yamazaki et al. .............. 257/88 |
| 6,964,891 B2 * | 11/2005 | Hotta ............................. 438/197 |
| 7,019,327 B2 * | 3/2006 | Lee et al. ......................... 257/40 |
| 2003/0059984 A1 * | 3/2003 | Sirringhaus et al. ......... 438/141 |
| 2003/0059987 A1 | 3/2003 | Sirringhaus et al. |
| 2004/0178428 A1 | 9/2004 | Chou et al. |
| 2004/0182816 A1 * | 9/2004 | Chung et al. ................... 216/23 |
| 2005/0009248 A1 * | 1/2005 | Weng et al. ................... 438/149 |

FOREIGN PATENT DOCUMENTS

| | | |
|---|---|---|
| JP | 2003-318190 | 7/2003 |
| WO | WO 03/052841 A1 | 6/2003 |
| WO | WO 2004/079833 A1 | 9/2004 |
| WO | 2004/107473 A1 | 12/2004 |

OTHER PUBLICATIONS

Quirk et al., Semiconductor Manufacturing Technology, Prentice Hall, Upper Saddle River, New Jersey, 2001, pp. 438-439.*

(Continued)

*Primary Examiner* — Matthew Landau
*Assistant Examiner* — Sun M Kim
(74) *Attorney, Agent, or Firm* — Knobbe Martens Olson & Bear LLP

(57) ABSTRACT

Provided are an organic TFT, a method of manufacturing the same, and a flat panel display having the same. The organic TFT includes source and drain electrodes formed on the surface of a substrate, an organic semiconductor layer that includes source and drain regions and a channel region, located on the source and drain electrodes, a gate electrode located above the organic semiconductor layer, and a first insulating layer located on the surface of the organic semiconductor layer, wherein a through hole is formed in at least a portion of the organic semiconductor layer and the first insulating layer, outside an active region that includes the source and drain regions and the channel region.

17 Claims, 6 Drawing Sheets

OTHER PUBLICATIONS

Fix et al. (2002) Fast polymer integrated circuits. Applied Physics Letters. 81(9):1735-1737.

Schroeder et al. (2004) Improving organic transistor performance with Schottky contacts. Applied Physics Letters. 84(6):1004-1006.

EPO Communication dated Mar. 16, 2006 enclosing the extended European search report, 7 pages.

Chinese Intellectual Property Office Communication dated Dec. 2, 2009, 28 pgs, Samsung Mobile Display Co., Ltd.

* cited by examiner

ORGANIC THIN FILM TRANSISTOR, METHOD OF MANUFACTURING THE SAME, AND FLAT PANEL DISPLAY HAVING THE SAME

CROSS-REFERENCE TO RELATED APPLICATIONS

This application claims the priority of Korean Patent Application No. 10-2004-0091489 filed on Nov. 10, 2004, in the Korean Intellectual Property Office, the disclosure of which is incorporated herein in its entirety by reference.

BACKGROUND OF THE INVENTION

1. Field of the Invention

The present embodiments relate to an organic thin film transistor (organic TFT), a method of manufacturing the same, and a flat panel display having the organic TFT, and more particularly, to an organic TFT structure that can prevent malfunction of devices due to cross-talk between adjacent organic TFTs, a method of manufacturing the organic TFT, and a flat panel display having the organic TFT.

2. Description of the Related Art

TFTs are used as switching and driving devices, for controlling and driving the pixels in flat panel displays, such as a liquid crystal display (LCD), or an electroluminescent display (ELD).

A TFT has source and drain regions doped with a high concentration of dopant, a semiconductor layer having a channel region formed between the source and drain regions, a gate electrode located on a region corresponding to the channel region and insulated from the semiconductor layer, and source and drain electrodes contacting the source and drain regions.

Current flat panel display devices require flexibility in addition to slimness.

To meet the flexibility requirement, the use of a plastic substrate instead of a glass substrate has been attempted. However, when a plastic substrate is used, low temperature processes must be employed. Therefore, conventional polysilicon TFTs cannot be used.

As a solution to this problem, organic semiconductors have been developed. The organic semiconductor has the advantage of cheap manufacture, since it can be processed at a low temperature.

However, malfunction due to cross-talk between adjacent organic TFTs is a problem causing less use of organic TFTs.

SUMMARY OF THE INVENTION

The present embodiments provide an organic TFT structure that can prevent malfunction due to cross-talk between adjacent organic TFTs, a method of manufacturing the organic TFT, and a flat panel display device having the organic TFT.

According to an aspect of the present embodiments, there is provided an organic TFT comprising source and drain electrodes formed on the surface of a substrate, an organic semiconductor layer that includes source and drain regions and a channel region, located on the source and drain electrodes, a gate electrode located above the organic semiconductor layer, and a first insulating layer located on the surface of the organic semiconductor layer, wherein a through hole is formed in at least a portion of the organic semiconductor layer and the first insulating layer, outside an active region that includes the source and drain regions and the channel region.

The through hole can form a closed curve around the region of the organic semiconductor layer that includes the source and drain regions and the channel region.

The organic semiconductor layer can include at least one of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, polythiophene and its derivatives, polyparaphenylenevinylene and its derivatives, polyparaphenylene and its derivatives, polyfluorene and its derivatives, polyfluorene-oligothiopene copolymer and its derivatives, polythiophene vinylene and its derivatives, polythiophene-heterocyclic aromatic copolymer and its derivatives, oligoacene of naphthalene and its derivatives, alpha-5-thiophene oligothiophene and its derivatives, phthalocyanine that does not include a metal and its derivatives, pyromellitic dianhydride and its derivatives, pyromellitic diimide and its derivatives, perylene tetracarboxylic acid dianhydride and its derivatives, and perylene tetracarboxylic diimide and its derivatives, naphthalene tetracarboxylic diimide and its derivatives, and naphthalene tetracarboxylic acid dianhydride and its derivatives.

The first insulating layer can include a photoresist or a negative photoresist.

The negative photoresist can include, for example, at least one of polyimide resin, acryl resin, epoxy resin, hydroxystyrene resin, phenol resin, poly phenol resin, and derivatives thereof.

The organic TFT can further include a second insulating layer covering the surface of the first insulating layer.

The second insulating layer can be, for example, an inorganic insulating layer that includes at least one of $SiO_2$, SiNx, SiON, $Al_2O_3$, $Ta_2O_5$, BST (barium, strontium and titanate composite), and PZT (lead zirconate titanate composite).

The second insulating layer can be a polymer organic insulating layer that includes at least one of an acryl polymer that includes polymethyl methacrylate (PMMA) derivatives, polystyrene copolymer that includes polystyrene (PS) derivatives, polyvinyl arylene polymer that includes poly(1-vinyl naphthalene) (PVN) derivatives, polybutadiene copolymer, polyisobutadiene copolymer, phenol polymer that includes poly(4-vinyl phenol) (PVP) derivatives, novolak resin, imide polymer, aryl ester polymer, amide polymer, fluoride polymer which can be partially or completely substituted by fluoride, p-xylylene polymer that includes parylene derivatives, vinyl alcohol polymer that includes polyvinyl alcohol (PVA) derivatives, methylsiloxane acid polymer, and derivatives thereof.

The polymer organic insulating layer comprises non-hardening polymer.

The polymer organic insulating layer comprises hardening polymer.

The first insulating layer and the second insulating layer comprise the same material.

According to another aspect of the present embodiments, there is provided a flat panel display device comprising an organic TFT layer formed on the surface of a substrate; and a pixel unit electrically connected to the organic TFT layer, wherein the organic TFT layer includes: a source electrode and a drain electrode formed on the surface of the substrate; an organic semiconductor layer that includes source and drain regions and a channel region, located on the source and drain electrodes; a gate electrode located above the organic semiconductor layer; and an first insulating layer located on the organic semiconductor layer, and a through hole formed in at least a portion of the organic semiconductor layer and the first insulating layer, outside an active region that includes the source and drain regions and the channel region.

The through hole can form a closed curve around the region of the organic semiconductor layer that includes the source and drain regions and the channel region.

The organic semiconductor layer can include at least one of pentacene, tetracene, anthracene, naphthalene, alpha-6-thiophene, perylene and its derivatives, rubrene and its derivatives, coronene and its derivatives, perylene tetracarboxylic diimide and its derivatives, perylene tetracarboxylic dianhydride and its derivatives, polythiophene and its derivatives, polyparaphenylenevinylene and its derivatives, polyparaphenylene and its derivatives, polyfluorene and its derivatives, polyfluorene-oligothiopene copolymer and its derivatives, polythiophene vinylene and its derivatives, polythiophene-heterocyclic aromatic copolymer and its derivatives, oligonaphthalene and its derivatives, alpha-5-thiophene oligothiophene and its derivatives, phthalocyanine that does not include a metal and its derivatives, pyromellitic dianhydride and its derivatives, pyromellitic diimide and its derivatives, perylene tetracarboxylic acid dianhydride and its derivatives, perylene tetracarboxylic diimide and its derivatives, naphthalene tetracarboxylic diimide and its derivatives, and naphthalene tetracarboxylic acid dianhydride and its derivatives.

The first insulating layer can include a photoresist or a negative photoresist.

The negative photoresist can include at least one of polyimide resin, acryl resin, epoxy resin, hydroxystyrene resin, phenol resin, and derivatives thereof.

The flat panel display device can further comprise a second insulating layer covering the surface of the first insulating layer.

The second insulating layer can be an inorganic insulating layer that can include, for example at least one of $SiO_2$, SiNx, SiON, $Al_2O_3$, $Ta_2O_5$, BST, and PZT.

The second insulating layer can be a polymer organic insulating layer that includes at least one of acryl polymer that includes poly methylmethacrylate (PMMA) derivatives, polystyrene copolymer that includes polystyrene (PS) derivatives, polyvinyl arylene polymer that includes poly(1-vinyl naphthalene) (PVN) derivatives, polybutadiene copolymer, polyisobutadiene copolymer, phenol polymer that includes poly(4-vinyl phenol) (PVP) derivatives, novolak resin, imide polymer, arylester polymer, amide polymer, fluoride polymer which can be partially or completely substituted by fluoride, p-xylylene polymer that includes parylene derivatives, vinyl alcohol polymer that includes polyvinyl alcohol (PVA) derivatives, methylsiloxane acid polymer, and derivatives thereof.

The polymer organic insulating layer comprises, for example, non-hardening polymer or hardening polymer.

The first insulating layer and the second insulating layer comprises the same material.

According to another aspect of the present embodiments, there is provided a method of manufacturing an organic TFT, comprising: forming source and drain electrodes on the surface of a substrate; forming an organic semiconductor layer on the surface of the source and drain electrodes; forming a first insulating layer on the surface of the organic semiconductor layer; patterning the first insulating layer to form a through hole in at least a portion of the first insulating layer outside an active region that includes source and drain regions and a channel region of the organic semiconductor layer; forming an organic semiconductor layer through hole by removing a portion of the organic semiconductor layer exposed through the through hole; and forming a gate electrode on the first insulating layer.

The insulating through hole and the organic semiconductor layer through hole can form a closed curve.

The organic semiconductor layer can include, for example, at least one of pentacene, tetracene, anthracene, naphthalene, alpha-6-thiophene, perylene and its derivatives, rubrene and its derivatives, coronene and its derivatives, perylene tetracarboxylic diimide and its derivatives, perylene tetracarboxylic dianhydride and its derivatives, polythiophene and its derivatives, poly paraphenylene vinylene and its derivatives, poly paraphenylene and its derivatives, polyfluorene and its derivatives, polyfluorene-oligothiopene copolymer and its derivatives, polythiophene vinylene and its derivatives, polythiophene-heterocyclic aromatic copolymer and its derivatives, oligonaphthalene and its derivatives, alpha-5-thiophene oligothiophene and its derivatives, phthalocyanine that does not include a metal and its derivatives, pyromellitic dianhydride and its derivatives, pyromellitic diimide and its derivatives, perylene tetracarboxylic acid dianhydride and its derivatives, perylene tetracarboxylic diimide and its derivatives, naphthalene tetracarboxylic diimide and its derivatives, and naphthalene tetracarboxylic acid dianhydride and its derivatives.

The first insulating layer comprises a material that includes a photoresist or a negative photoresist.

The negative photoresist can include at least one of a polyimide resin, acryl resin, epoxy resin, hydroxystyrene resin, phenol resin, polyphenol resin, and derivatives thereof.

The method can further comprise forming additional insulating layers that include a second insulating layer on at least the first insulating layer, between forming the organic semiconductor layer through hole and forming the gate electrode, wherein the gate electrode can form on the additional insulating layers.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION OF THE INVENTION

The present embodiments will now be described more fully with reference to the accompanying drawings in which exemplary aspects are shown.

Figure 1A:
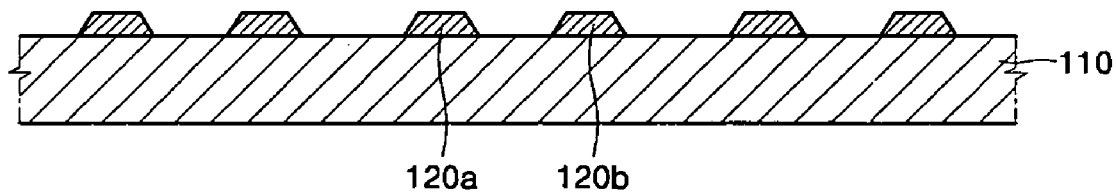
FIGS. 1A through 1F are cross-sectional views illustrating a method of manufacturing an organic TFT according to an embodiment.

FIGS. 1A through 1F are cross-sectional views illustrating a method of manufacturing an organic TFT according to one embodiment. Referring to FIG. 1A, source and drain electrodes 120a and 120b are formed through appropriate patterning processes after forming a conductive layer on a substrate 110.

Here, the substrate 110 can be, for example, a glass material, or a plastic material such as polyethylene terephthalate (PET), polyethylene naphthalate (PEN), polyether sulfone (PES), polyether imide, polyphenylene sulfide (PPS), polyallylate, polyimide, polycarbonate (PC), cellulose triacetate (TAC), or cellulose acetate propinonate (CAP).

The source and drain electrodes can be formed of various materials, but they are preferably formed of a metal in consideration of close contact with the substrate 110. In some cases, a buffer layer (not shown) can further be included to prevent damage to the substrate 110 while manufacturing the source and drain electrodes 120a and 120b.

Figure 1B:
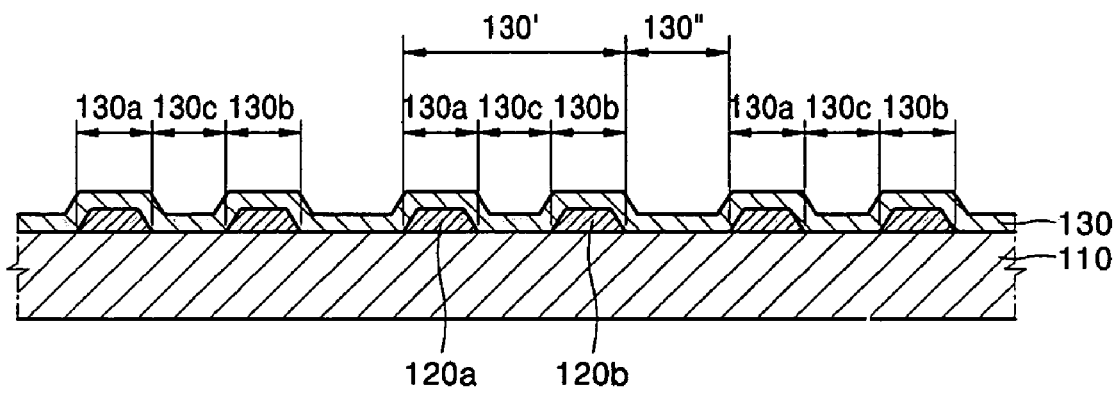

As depicted in FIG. 1B, after forming the source and drain electrodes 120a and 120b, an organic semiconductor layer 130 is formed on the surface of the source and drain electrodes 120a and 120b. The organic semiconductor layer 130 preferably includes at least one of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, polythiophene and its derivatives, polyparaphenylene vinylene and its derivatives, polyparaphenylene and its derivatives, polyfluorene and its derivatives, polythiopene vinylene and its derivatives, polythiophene-hetero ring aromatic copolymer and its derivatives, oligonaphthalene and its derivatives, alpha-5-thiophene oligothiophene and its derivatives, phthalocyanine that does not include a metal and its derivatives, phyromellitic dianhydride and its derivatives, phyromellitic diimide and its derivatives, perrylene tetracarboxy acid dianhydride and its derivatives, and perrylene tetracarboxylic diimide and its derivatives, naphthalene tetracarboxylic diimide and its derivatives, and naphthalene tetracarboxylic acid dianhydride and its derivatives.

The organic semiconductor layer 130 comprises an active region 130' and an outer region or non-active region 130" outside the active region 130'. The active region 130' includes a source region 130a that contacts the source electrode 120a, a drain region 130b that contacts the drain electrode 120b, and a channel region 130c.

Figure 1C:
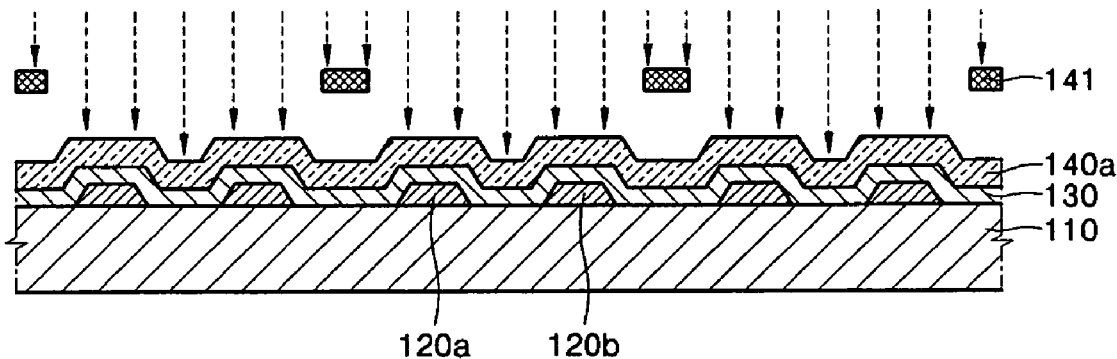
Figure 1D:
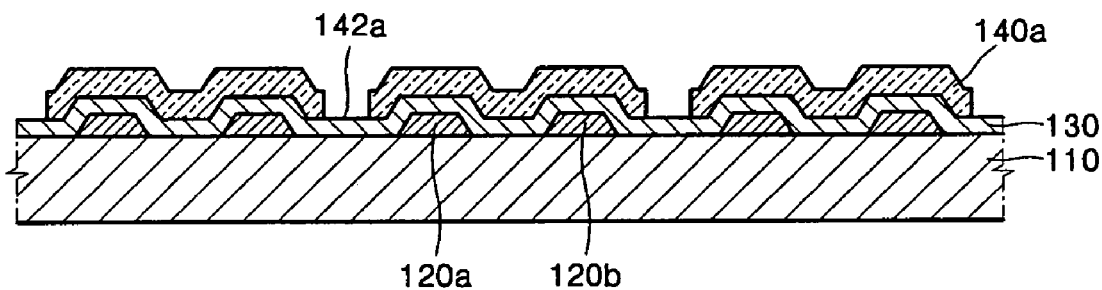

After forming the organic semiconductor layer 130, a plurality of insulating layers are formed on the surface of the organic semiconductor layer 130. Referring to FIG. 1C, a first insulating layer 140a is formed on the surface of the organic semiconductor layer 130. Also, as depicted in FIG. 1D, an insulating through hole 142a is formed in the first insulating layer 140a by an appropriate patterning process. Although having been described with reference to the cross-sectional view, the insulating through hole 142a may be seen as a groove in a plane view of the organic TFT.

The first insulating layer 140a can be patterned by various methods, but, as depicted in FIGS. 1C and 1D, in the present embodiment it is patterned using photolithography. That is, the first insulating layer 140a can be patterned through a simple exposure and developing process by using a material that includes a photoresist for the first insulating layer 140a. The first insulating layer 140a can be formed of various other insulating materials besides the photoresist, but the selected material must be easily processed in consideration of the subsequent process for forming the insulating through hole 142a.

The insulating through hole 142a formed in the first insulating layer 140a is formed outside of the active region 130' (see FIG. 1B) of the organic semiconductor layer 130 that includes the source and drain regions and channel region; that is, a region between organic TFTs. The insulating through hole 142a can be formed on one side of the outer region of the organic semiconductor layer 130, or can form a closed curve that surrounds the outer region of the organic semiconductor layer 130, but the present embodiments are not limited thereto. That is, the insulating through hole 142a can be formed in any region except the active region 130' of the organic semiconductor layer 130.

The insulating through hole 142a can be formed by various methods, but, in the present embodiment, it can be formed using photolithography in a material that includes a photoresist. The insulating through hole 142a in the first insulating layer 140a can be formed by exposing the first insulating layer 140a in the region which corresponds to the active region 130' of the organic semiconductor layer 130, with a light source (not shown) using an appropriate mask pattern 141, and developing after forming the first insulating layer 140a using a material that includes a negative photoresist as depicted in FIG. 1C. The first insulating layer 140a can have solvent resistance in a process for removing the organic semiconductor layer 130 exposed through the insulating through hole 142a, by using a negative photoresist as the first insulating layer 140a, or the dimensional stability of the first insulating layer 140a can be maintained while forming a second insulating layer 140b (See FIG. 2A). In the present embodiment, the insulating through hole 142a is formed by exposing and developing, but the present embodiments are not limited thereto.

Figure 1E:
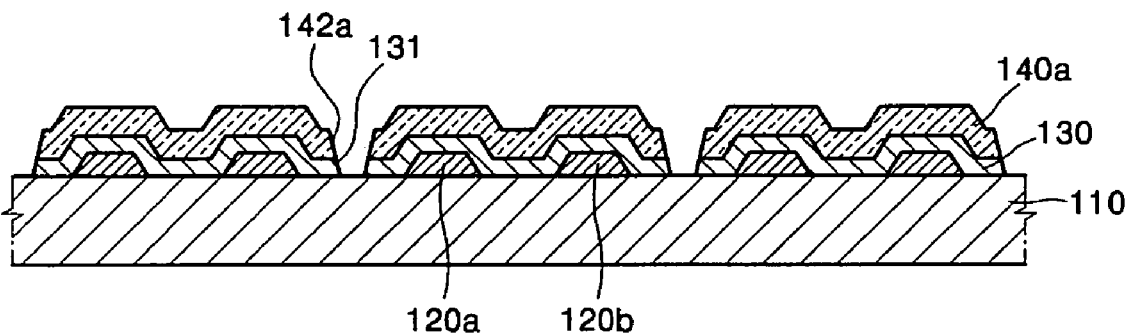

Referring to FIG. 1E, an organic semiconductor layer through hole 131 is formed by removing at least a portion of the non-active region 130" (See FIG. 1B) of the exposed organic semiconductor layer 130 through the insulating through hole 142a, after forming the insulating through hole 142a in the first insulating layer 140a.

The organic semiconductor layer through hole 131 can be formed by using a solvent that can dissolve the organic semiconductor that forms the organic semiconductor layer 130. At this time, the portions of the organic semiconductor layer 130 that are not exposed by the first insulating layer 140a are protected from contact with the solvent. However, in removing a portion of the non-active region 130" of the organic semiconductor layer 130 using a solvent, the width of the insulating through hole 142a and the amount of solvent must be appropriately selected to prevent the penetration of solvent into the non-active region 130" of the organic semiconductor layer 130 through the sides of the insulating through hole 142a. Particularly, if the solvent is too aggressive or an excessive amount is used, damage can occur to unwanted regions by the penetration of the solvent. On the other hand, if the solvent is too weak or too little is used, the non-active region 130" of the organic semiconductor layer 130 exposed through the insulating through hole 142a can not be completely removed, resulting in cross talk. Therefore, the selection of the solvent is very important.

The malfunction due to cross talk between adjacent organic TFTs can be prevented by forming the organic semiconductor layer through hole 131 at a portion of the non-active region 130" (See FIG. 1B), that is, the region outside the active region 130'(See FIG. 1B) of the organic semiconductor layer 130. The organic semiconductor layer through hole 131 can form a closed curve like the insulating through hole 142a, or can be formed in all regions except the active region 130' of the organic semiconductor layer 130.

Figure 1F:
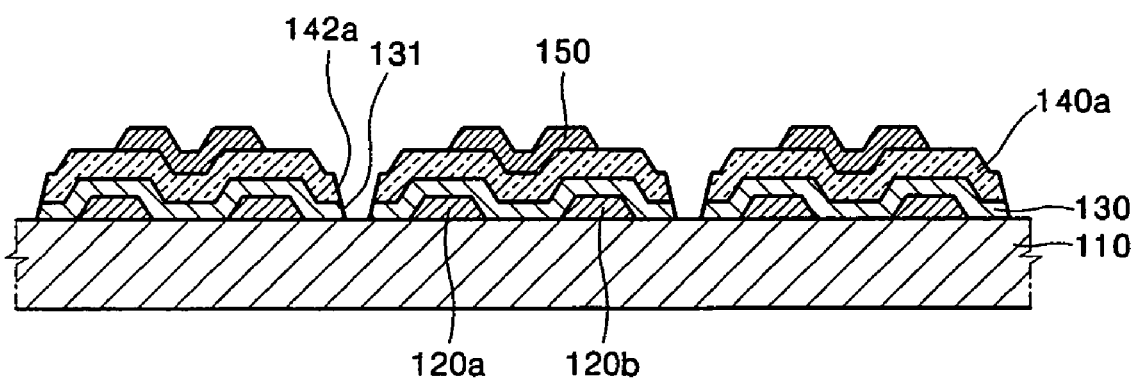

Referring to FIG. 1F, a gate electrode 150 is formed on the first insulating layer 140a after forming the organic semiconductor layer through hole 131. The gate electrode 150 can be formed in a region crossing the source and drain electrodes 120a and 120b and the active region 130' (See FIG. 1B) of the organic semiconductor layer 130. The gate electrode 150 comprises, for example a metal, such as Mo or W, or a conductive material, such as a conductive polymer, for example, polyaniline. The gate electrode 150 can be formed by a deposition method such as a fine metal mask (FMM), but the present embodiments are not limited thereto.

Figure 2A:
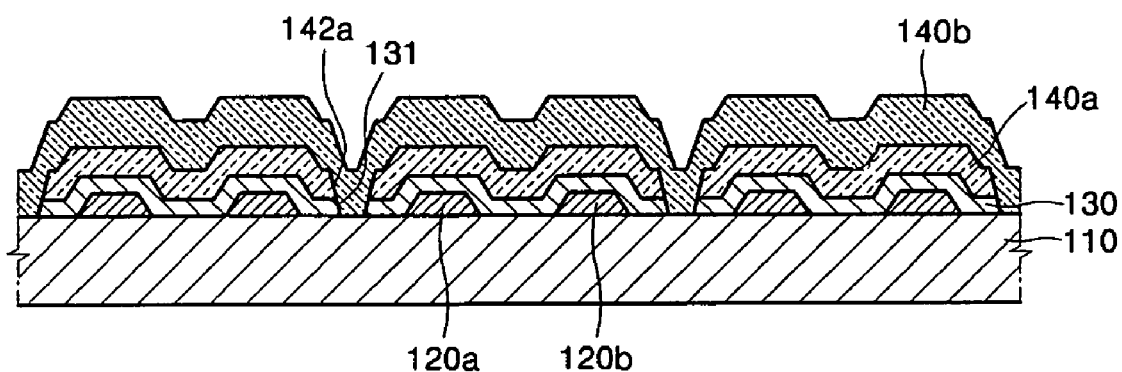
FIGS. 2A and 2B are cross-sectional views illustrating a modified version of the organic TFT according to an embodiment.
Figure 2B:
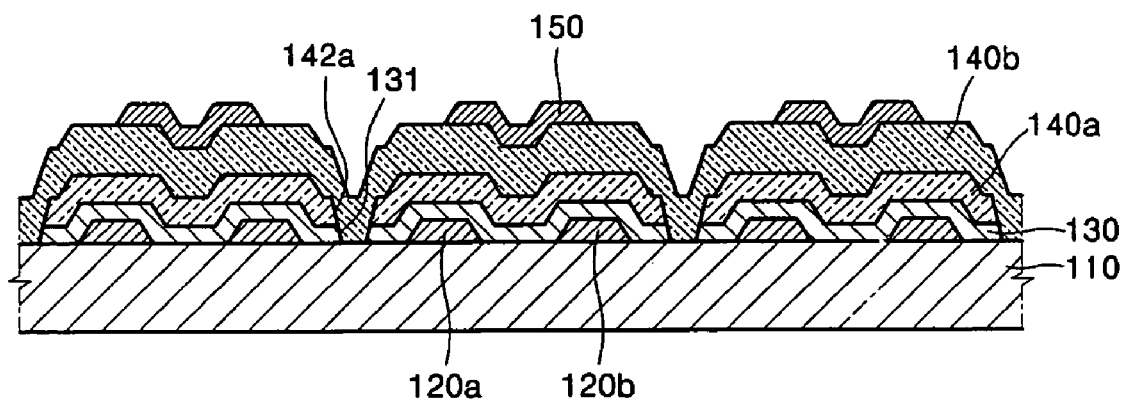

FIGS. 2A and 2B are cross-sectional views illustrating a modified version of the organic TFT according to an embodiment.

After forming the organic semiconductor layer through hole 131 as depicted in FIG. 1E, a second insulating layer 140b can be formed on the first insulating layer 140a as depicted in FIG. 2A. The second insulating layer 140b can be formed of a variety of materials, such as, for example, an inorganic insulating layer that includes at least one of $SiO_2$, SiNx, SiON, $Al_2O_3$, $Ta_2O_5$, BST, and PZT in consideration of close contact with the first insulating layer 140a, a polymer organic insulating layer such as an acryl polymer that includes poly methyl methacrylate (PMMA) derivatives, a polystyrene copolymer that includes polystyrene (PS) derivatives, a polyvinyl arylene polymer that includes poly(1-vinyl naphthalene) (PVN) derivatives, polybutadiene copolymer, polyisobutadiene copolymer, phenol polymer that includes poly(4-vinyl phenol) derivatives, novolak resins, imide polymer, aryl ester polymer, amide polymer, a fluoride polymer partly or completely substituted by fluoride, p-xylylene polymer, or a multiple insulating layer that includes inorganic insulating layers and organic insulating layers. The polymer organic insulating layer can be formed of a non-hardening polymer or polymer hardened by heat and/or ultraviolet rays.

The second insulating layer 140b is disposed at least in the insulating through hole 142a and the organic semiconductor layer through hole 131. Therefore, the disposition of the conductive material on the organic semiconductor layer through hole 131 can be prevented in a subsequent process of forming a conductive layer such as the gate electrode 150 (see FIG. 1G). Therefore, cross talk between adjacent TFTs can be prevented.

In the present embodiment, the first insulating layer 140a can be formed of a different material from the second insulating layer 140b, but the present embodiments are not limited thereto. That is, if a plurality of insulating layers including the first insulating layer 140a and the second insulating layer 140b can be formed, and if through holes are formed in at least portions of the organic semiconductor layer 130 and the first insulating layer 140a along the outer region of the active region of the organic semiconductor layer, the first insulating layer 140a and the second insulating layer 140b can be formed of the same material.

Referring to FIG. 2B, a gate electrode 150 is formed at the crossing point between the source and drain electrodes 120a and 120b and the active region 130' of the organic semiconductor layer 130, on the surface of the second insulating layer 140b, after forming the second insulating layer 140b. The gate electrode 150 comprises, for example a metal such as Mo or W, or a conductive material such as a conductive polymer, for example, polyaniline.

Figure 3:
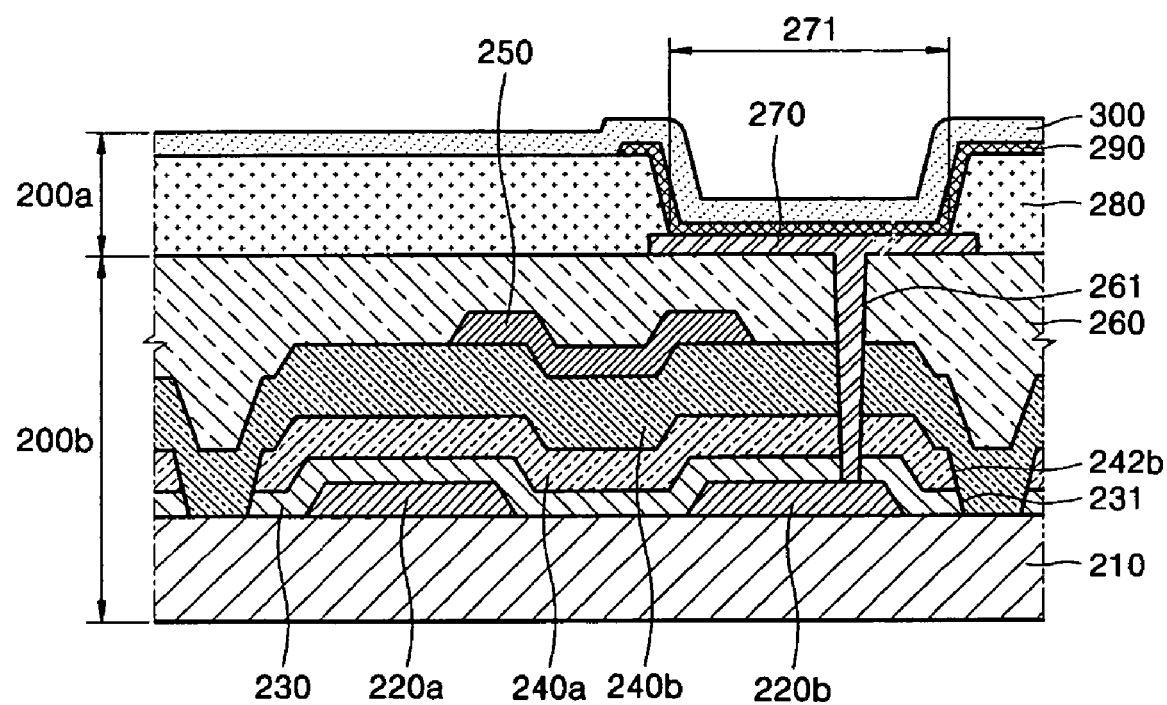
FIG. 3 is a cross-sectional view illustrating an electroluminescence display according to another embodiment.
Figure 4:
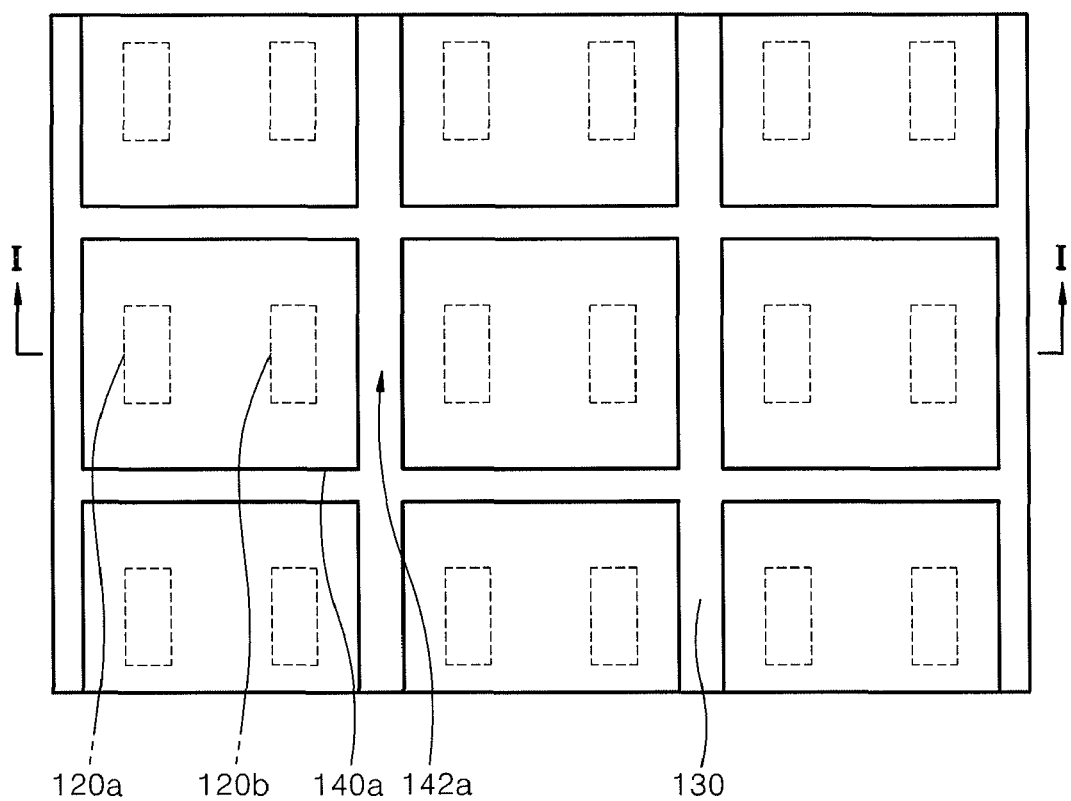
FIG. 4 is a cross-sectional view illustrating an electroluminescence display according to another embodiment.

The organic TFT according to the present embodiments can be structured in many ways. FIG. 3 is a cross-sectional view illustrating an ELD according to another embodiment. For convenience of explanation, one organic TFT and one display pixel are depicted in FIG. 3, but the present embodiments are not limited thereto.

A display region of an ELD 200 includes a pixel unit 200a and an organic TFT layer 200b. The organic TFT layer 200b has the same structure as the organic TFT described above. Source and drain electrodes 220a and 220b, and an organic semiconductor layer 230 covering the source and drain electrodes 220a and 220b, are formed on the surface of the substrate 210. A first insulating layer 240a and a second insulating layer 240b are formed on the organic semiconductor layer 230. A gate electrode 250 is located on the second insulating layer 240b. A planarizing layer 260 covers the organic TFT layers as an insulating layer. In FIG. 3, the gate electrode 250 is covered by the planarizing layer 260, but the present embodiments are not limited thereto. For example, an inorganic insulating layer (not shown) can be interposed between the gate electrode 250 and the planarizing layer 260.

A first electrode layer 270 is formed on the surface of the planarizing layer 260, and is electrically connected to the drain electrode 220b of the organic TFT layer 200b through a via hole 261 formed through the first insulating layer 240a, the second insulating layer 240b, and the planarizing layer 260.

The first electrode layer 270 can be formed in various structures. For example, as depicted in FIG. 3, if the first electrode layer 270 can function as an anode and can be a front emission type, it can include a reflection electrode that includes, for example, Ag, Mg, Al, Pt, Pd, Au, Ni, Nd, Ir, Cr, or a compound of these metals and a transparent electrode formed of the reflection electrode. If the first electrode layer 270 is a bottom emission type, the first electrode layer 270 can be a transparent electrode comprising a conductive transparent material such as ITO, IZO, ZnO, or $In_2O_3$. The structure of the first electrode layer 270 is not limited to a single layer or a double layer, but can be formed of multiple layers.

A pixel defining layer 280 is formed on the surface of the planarizing layer 260, to define a pixel opening 271 for passing light out from the surface of the first electrode layer 270. An organic electroluminescent unit 290 is formed on the surface of the first electrode layer 270.

The organic electroluminescent unit 290 can include, for example a low molecular weight organic film or a polymer organic film. If the organic electroluminescent unit 290 comprises a low molecular weight organic film, the organic electroluminescent unit 290 can be formed in a single or a composite structure by stacking a Hole Injection Layer (HIL), a Hole Transport Layer (HTL), an Emission Layer (EML), an Electron Transport Layer (ETL), and an Electron Injection Layer (EIL). The organic materials that can be used for forming the intermediate layer include copper phthalocyanine (CuPc), N,N'-Di(naphthalene-1-yl)-N,N'-diphenyl-benzidine (NPB), and tris-8-hydroxyquinoline aluminum (Alq3). The low molecular weight organic film can be formed by an evaporation method.

If the organic electroluminescent unit 290 is formed of a polymer organic film, the organic electroluminescent unit 290 can have a structure including a HTL and an EML. The polymer HTL can be formed, for example, of poly-(2,4)-ethylene-dihydroxy thiophene (PEDOT), and the EML can be formed of a polymer organic material such as Poly-Phenylene vinylene (PPV), or polyfluorene. The organic electroluminescent unit 290 can be formed using ink jet printing or screen printing. However, the structure of the organic electroluminescent unit 290 in the polymer organic layer is not limited thereto.

A second electrode layer 300 can also have various structures according to the polarity of the electrode layer and the light emitting direction, like the first electrode layer 270. That is, if the second electrode layer 300 functions as a cathode and is a front emission type, then after forming an electrode with a matched work function on the surface of the organic electroluminescent unit 290 using a material such as Li, Ca, LiF/Ca, LiF/Al, Al, Ag, Mg, or a compound of these materials, a transparent electrode comprising ITO, IZO, ZnO, or $In_2O_3$ can be formed on the electrode. If the second electrode layer 300 is a bottom emission type, the second electrode layer 300 can be formed of more than one layer using a low work function material such as Li, Ca, LiF/Ca, LiF/Al, Al, Ag, Mg, or a compound of these metals. The second electrode layer 300 can be formed on the entire surface of the first electrode layer 270 and the pixel defining layer 280, but the present embodiments are not limited thereto. In the present embodiment, the first electrode layer 270 functions as an anode and the second electrode layer 300 functions as a cathode, but the polarity of the first electrode layer 270 and the second electrode layer 300 can be reversed.

Although not shown in the drawing, a display region composed of an organic TFT layer 200b and a pixel unit on the substrate 210 can be sealed by a sealing member. That is, the display region can be sealed by applying a sealing substrate on the second electrode layer 300, or by forming a thin film sealing layer or layers on the surface of the second electrode layer 300. The display region can be sealed in various ways and the sealing structure is not limited.

The present has been described with reference to the above embodiments, but is not limited thereto. That is, the organic TFT according to the present embodiments can be modified in many ways as long as an organic semiconductor layer through hole is formed in a organic semiconductor layer between adjacent organic TFTs. The organic TFTs can be applied to LCDs other than ELDs, or can be mounted on a driver circuit which does not display images, instead of a flat panel display device.

The organic TFTs according to the present embodiments have the following advantages.

First, malfunction due to cross talk between the organic TFTs can be prevented by separating adjacent organic TFTs through a simple additional process, such as forming a throughhole, while maintaining the same overall process for forming the organic semiconductor layer.

Second, when forming the insulating through hole, the use of a photoresist, especially a negative photoresist, as an insulating layer on the surface of the organic semiconductor layer allows for quick, cheap processing and high quality and resolution, while maintaining close contact with a lower organic semiconductor layer.

Third, a flat panel display having the organic TFT can display improved images since its structure prevents malfunction between pixels.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. An organic TFT comprising:
    a source electrode and a drain electrode formed on the surface of a substrate;
    an organic semiconductor layer that includes source and drain regions and a channel region, located on the source and drain electrodes;
    a gate electrode located above the organic semiconductor layer;
    a first insulating layer located on the surface of the organic semiconductor layer;
    a through hole formed in at least a portion of the organic semiconductor layer and the first insulating layer, outside an active region that includes the source and drain regions and the channel region, wherein one end of the through hole is wider than the other end, and
    wherein the first insulating layer comprises a photoresist comprising at least one of a polyimide resin, an epoxy resin, a hydroxystyrene resin, a phenol resin, a polyphenol resin, or derivatives thereof,
    wherein the through hole forms a closed curve around the region of the organic semiconductor layer that includes the source and drain regions and the channel region, and wherein the through hole is at least partly filled with a second insulating layer and a portion of the second insulating layer is located below the gate electrode and above the source and drain electrodes, and wherein the first insulating layer is located between the second insulating layer and the organic semiconductor layer;
    wherein the second insulating layer continuously covers the first insulating layer and a first insulating layer of an adjacent TFT.

2. The organic TFT of claim 1, wherein the organic semiconductor layer comprises at least one of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, polythiophene and its derivatives, polyparaphenylenevinylene and its derivatives, polyparaphenylene and its derivatives, polyfluorene and its derivatives, polyfluorene-oligothiopene copolymer and its derivatives, polythiophene vinylene and its derivatives, polythiophene-heterocyclic aromatic copolymer and its derivatives, oligoacene of naphthalene and its derivatives, alpha-5-thiophene oligothiophene and its derivatives, phthalocyanine that does not include a metal and its derivatives, pyromellitic dianhydride and its derivatives, pyromellitic diimide and its derivatives, perylene tetracarboxylic acid dianhydride and its derivatives, perylene tetracarboxylic diimide and its derivatives, naphthalene tetracarboxylic diimide and its derivatives, or naphthalene tetracarboxylic acid dianhydride and its derivatives.

3. The organic TFT of claim 1, wherein the second insulating layer comprises an inorganic insulating layer that includes at least one of $SiO_2$, $SiN_x$, $SiON$, $Al_2O_3$, $Ta_2O_5$, BST, or PZT.

4. The organic TFT of claim 1, wherein the second insulating layer comprises a polymer organic insulating layer comprising at least one of an acryl polymer that includes poly methylmethacrylate (PMMA) derivatives, polystyrene copolymer that includes polystyrene (PS) derivatives, polyvinyl arylene polymer that includes poly(1-vinyl naphthalene) (PVN) derivatives, polybutadiene copolymer, polyisobutadiene copolymer, phenol polymer that includes poly(4-vinyl phenol) (PVP) derivatives, novolak resin, imide polymer, arylester polymer, amide polymer, fluoride polymer in which partially or completely substituted by fluoride, p-xylylene polymer that includes parylene derivatives, vinyl alcohol polymer that includes polyvinyl alcohol (PVA) derivatives, methylsiloxan acid polymer, and derivatives thereof.

5. The organic TFT of claim 4, wherein the polymer organic insulating layer comprises non-hardening polymer.

6. The organic TFT of claim 4, wherein the polymer organic insulating layer comprises hardening polymer.

7. The organic TFT of claim 1, wherein the first insulating layer and the second insulating layer comprise the same material.

8. A flat panel display comprising:
    an organic TFT layer formed on the surface of a substrate; and
    a pixel unit electrically connected to the organic TFT layer, wherein the organic TFT layer includes:
    a source electrode and a drain electrode formed on the surface of the substrate;

an organic semiconductor layer that includes source and drain regions and a channel region, located on the source and drain electrodes;

a gate electrode located above the organic semiconductor layer;

a first insulating layer located on the organic semiconductor layer;

a through hole formed in at least a portion of the organic semiconductor layer and the first insulating layer, outside an active region that includes the source and drain regions and the channel region, wherein one end of the through hole is wider than the other end, and wherein the first insulating layer comprises a photoresist comprising at least one of a polyimide resin, an epoxy resin, a hydroxystyrene resin, a phenol resin, a polyphenol resin, or derivatives thereof;

wherein the through hole forms a closed curve around the region of the organic semiconductor layer that includes the source and drain regions and the channel region, and wherein the through hole is filled with a second insulating layer and a portion of the second insulating layer is located below the gate electrode and above the source and drain electrodes, and wherein the first insulating layer is located between the second insulating layer and the organic semiconductor layer;

wherein the second insulating layer continuously covers the first insulating layer and a first insulating layer of an adjacent TFT.

9. The flat panel display of claim 8, wherein the organic semiconductor layer comprises at least one of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, polythiophene and its derivatives, polyparaphenylenevinylene and its derivatives, polyparaphenylene and its derivatives, polyfluorene and its derivatives, polyfluorene-oligothiopene copolymer and its derivatives, polythiophene vinylene and its derivatives, polythiophene-heterocyclic aromatic copolymer and its derivatives, oligoacene of naphthalene and its derivatives, alpha-5-thiophene oligothiophene and its derivatives, phthalocyanine that does not include a metal and its derivatives, pyromellitic dianhydride and its derivatives, pyromellitic diimide and its derivatives, perylene tetracarboxylic acid dianhydride and its derivatives, perylene tetracarboxylic diimide and its derivatives, naphthalene tetracarboxylic diimide and its derivatives, or naphthalene tetracarboxylic acid dianhydride and its derivatives.

10. The flat panel display of claim 8, wherein the second insulating layer comprises an inorganic insulating layer that includes at least one of $SiO_2$, $SiN_x$, $SiON$, $Al_2O_3$, $Ta_2O_5$, BST, and PZT.

11. The flat panel display of claim 8, wherein the second insulating layer comprises a polymer organic insulating layer comprising at least one of an acryl polymer that includes poly methylmethacrylate (PMMA) derivatives, polystyrene copolymer that includes polystyrene (PS) derivatives, polyvinyl arylene polymer that includes poly(1-vinyl naphthalene) (PVN) derivatives, polybutadiene copolymer, polyisobutadiene copolymer, phenol polymer that includes poly(4-vinyl phenol) (PVP) derivatives, novolak resin, imide polymer, arylester polymer, amide polymer, fluoride polymer which can be partially or completely substituted by fluoride, p-xylylene polymer that includes parylene derivatives, vinyl alcohol polymer that includes polyvinyl alcohol (PVA) derivatives, methylsiloxan acid polymer, and derivatives thereof.

12. The flat panel display of claim 11, wherein the polymer organic insulating layer comprises a non-hardening polymer.

13. The flat panel display of claim 11, wherein the polymer organic insulating layer comprises a hardening polymer.

14. The flat panel display of claim 8, wherein the first insulating layer and the second insulating layer comprise the same material.

15. A method of manufacturing an organic TFT, comprising:

forming source and drain electrodes on the surface of a substrate;

forming an organic semiconductor layer on the surface of the source and drain electrodes;

forming a first insulating layer comprising a photoresist on the surface of the organic semiconductor layer;

patterning the first insulating layer to form a through hole in at least a portion of the first insulating layer outside an active region that includes source and drain regions and a channel region;

forming an organic semiconductor layer through hole, by removing a portion of the organic semiconductor layer exposed through the through hole, wherein one end of the through hole is wider than the other end, wherein the photoresist comprises at least one of a polyimide resin, an epoxy resin, a hydroxystyrene resin, a phenol resin, a polyphenol resin, or derivatives thereof;

wherein the insulating through hole and the organic semiconductor layer through hole form a closed curve;

forming a second insulating layer on the first insulating layer, wherein the second insulating layer at least partially fills the through hole, and wherein the first insulating layer is located between the second insulating layer and the organic semiconductor layer;

forming a gate electrode on the second insulating layer;

wherein the second insulating layer continuously covers the first insulating layer and a first insulating layer of an adjacent TFT.

16. The method of claim 15, wherein the insulating through hole and the organic semiconductor layer through hole include all regions except the source and drain regions and the channel region of the organic semiconductor layer.

17. The method of claim 15, wherein the organic semiconductor layer comprises at least one of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, polythiophene and its derivatives, polyparaphenylenevinylene and its derivatives, polyparaphenylene and its derivatives, polyfluorene and its derivatives, polyfluorene-oligothiopene copolymer and its derivatives, polythiophene vinylene and its derivatives, polythiophene-heterocyclic aromatic copolymer and its derivatives, oligoacene of naphthalene and its derivatives, alpha-5-thiophene oligothiophene and its derivatives, phthalocyanine that does not include a metal and its derivatives, pyromellitic dianhydride and its derivatives, pyromellitic diimide and its derivatives, perylene tetracarboxylic acid dianhydride and its derivatives, perylene tetracarboxylic diimide and its derivatives, naphthalene tetracarboxylic diimide and its derivatives, or naphthalene tetracarboxylic acid dianhydride and its derivatives.

* * * * *

UNITED STATES PATENT AND TRADEMARK OFFICE
CERTIFICATE OF CORRECTION

PATENT NO. : 8,030,642 B2
APPLICATION NO. : 11/267425
DATED : October 4, 2011
INVENTOR(S) : Yang It is certified that error appears in the above-identified patent and that said Letters Patent is hereby corrected as shown below:

| Column | Line | Description of Discrepancy |
|--------|------|----------------------------|
| 2 | 12 | Change "oligothiopene" to --oligothiophene--. |
| 3 | 14 | Change "oligothiopene" to --oligothiophene--. |
| 4 | 11 | Change "oligothiopene" to --oligothiophene--. |
| 5 | 2 | Change "propinonate" to --propionate--. |
| 5 | 21 | Change "polythiopene" to --polythiophene--. |
| 5 | 25 | Change "phyromellitic" to --pyromellitic--. |
| 5 | 26 | Change "phyromellitic" to --pyromellitic--. |
| 5 | 26-27 | Change "perrylene" to --perylene--. |
| 5 | 28 | Change "perrylene" to --perylene--. |
| 10 | 24 | In Claim 2, change "oligothiopene" to --oligothiophene--. |

Signed and Sealed this
Seventh Day of August, 2012

David J. Kappos
*Director of the United States Patent and Trademark Office*

CERTIFICATE OF CORRECTION (continued)
U.S. Pat. No. 8,030,642 B2

| | | |
|---|---|---|
| 10 | 53 | In Claim 4, change "methylsiloxan" to --methylsiloxane--. |
| 11 | 40 | In Claim 9, change "oligothiopene" to --oligothiophene--. |
| 12 | 2 | In Claim 11, change "methylsiloxan" to --methylsiloxane--. |
| 12 | 54 | In Claim 17, change "oligothiopene" to --oligothiophene--. |